United States Patent [19]

Jewett

[11] 4,342,008
[45] Jul. 27, 1982

[54] SWITCHED TUNEABLE FREQUENCY MULTIPLIER

[75] Inventor: Robert E. Jewett, Berkeley, Calif.

[73] Assignee: Hewlett-Packard Company, Palo Alto, Calif.

[21] Appl. No.: 229,473

[22] Filed: Jan. 29, 1981

[51] Int. Cl.³ .................... H03B 19/00; H03B 23/00; H01P 1/218
[52] U.S. Cl. ........................................ 331/49; 331/76; 331/77; 331/178; 333/103; 333/218
[58] Field of Search ............. 333/100, 101, 103, 132, 333/218; 331/49, 76, 77; 328/18, 16; 307/319, 323, 524, 529

[56] References Cited

U.S. PATENT DOCUMENTS

| | | | |
|---|---|---|---|
| 3,296,550 | 1/1967 | Hukami et al. | 331/49 |
| 3,413,566 | 11/1968 | Parkyn | 331/49 |
| 3,646,426 | 2/1972 | Cohen | 333/218 |
| 3,711,784 | 1/1973 | Heise | 331/49 X |

Primary Examiner—Paul L. Gensler
Attorney, Agent, or Firm—Patrick J. Barrett

[57] ABSTRACT

A broadband high frequency signal generator is disclosed having a low and a high frequency swept signal source connected to a YIG tuned frequency multiplier. One end of an output coupling loop for the YIG is connected to ground through a PIN diode, and the low frequency signal source is connected to the junction of the output coupling loop and the PIN diode. When the PIN diode is caused to conduct, signals from the high frequency source are passed through the YIG tuned multiplier to an output in the conventional manner. When the PIN diode is not conducting, signals from the low frequency source are passed to the output through the output coupling loop.

9 Claims, 5 Drawing Figures

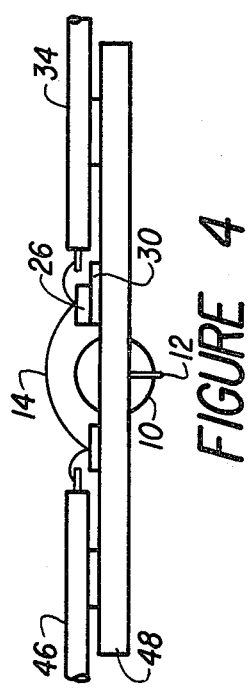
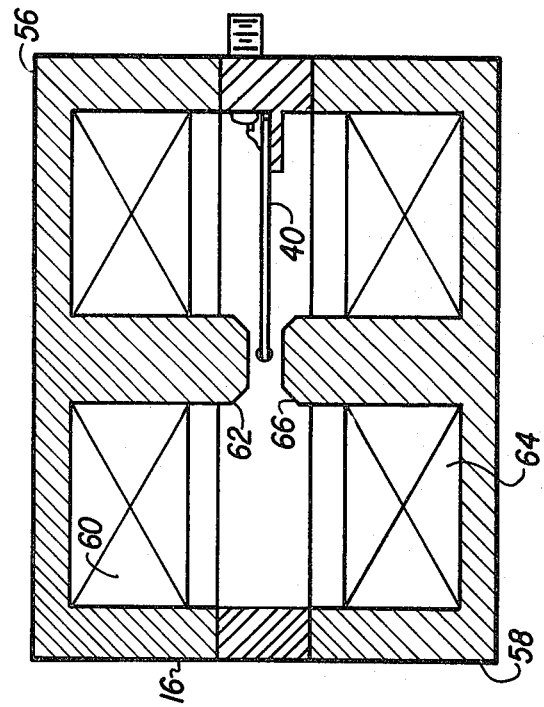
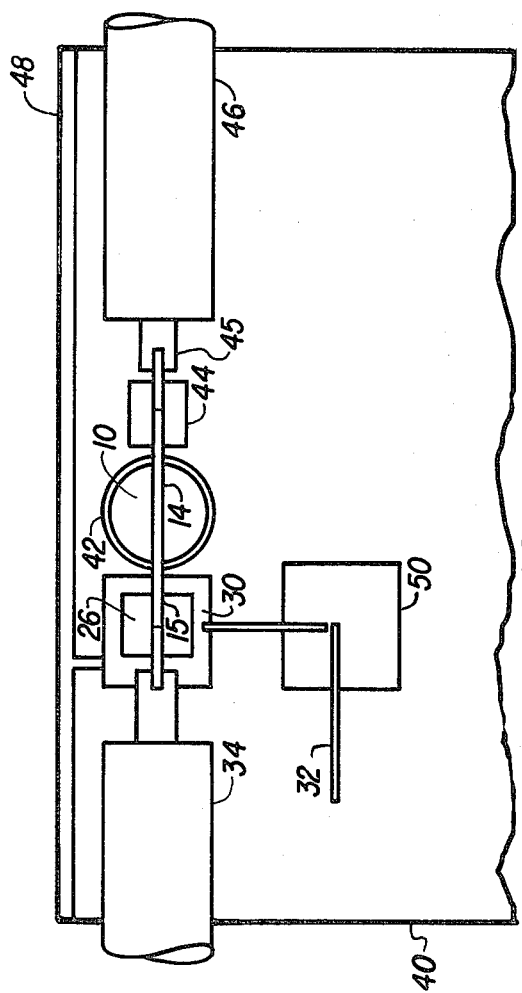
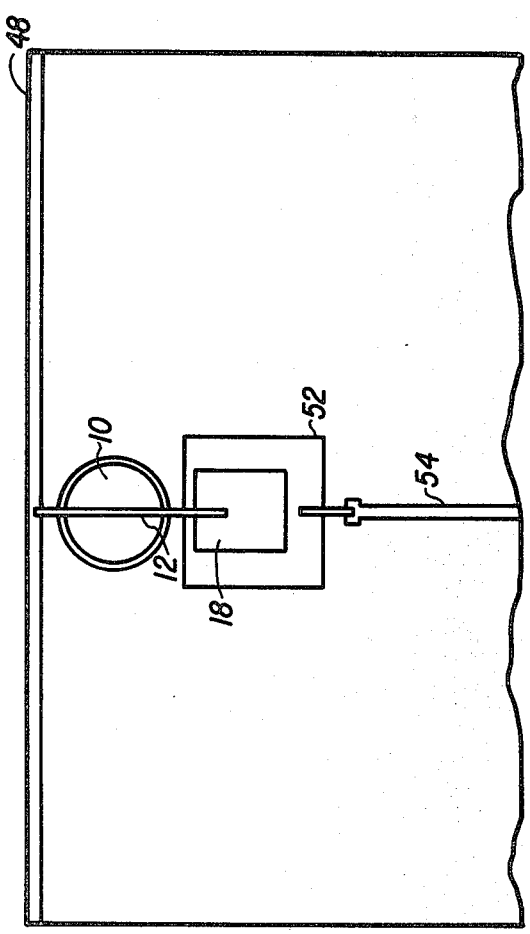

SWITCHED TUNEABLE FREQUENCY MULTIPLIER

BACKGROUND OF THE INVENTION

This invention relates to swept frequency signal generators and more particularly to tuneable filters for use in microwave swept frequency signal generators.

Swept frequency signal generators are used extensively for testing radio frequency and microwave communications equipment. Because of the broad range of signal frequencies used in modern communication equipment it is desirable to have test instrumentation that will cover a broad range of frequencies. Prior art swept frequency signal generators typically cover a broad range of frequencies by sweeping over several contiguous bands. Such a prior art device is described in an article entitled "A High-Performance 2-to-18-GHz Sweeper" by Paul R. Hernday and Carl J. Enlow in the *Hewlett-Packard Journal;* March 1975, pages 1-14. The lowest band is usually the fundamental frequency of the sweeping oscillator in the signal generator, for example 2 to 6 GHz. This frequency is multiplied, for example with a step recovery diode multiplier, to produce the higher frequency bands, e.g. 6 to 12 GHz, 12 to 18 GHz, etc. Since a diode multiplier produces many different harmonics of the fundamental at the same time, it is necessary to put a filter on the output of the multiplier in order to select the desired signal frequency. The most suitable type of filter for a multiband swept frequency signal generator is a tracking band pass filter using a yttrium-iron-garnet sphere as the tuneable resonant element, usually called a YIG filter.

One of the disadvantages of the type of swept frequency signal generator just described is that it is sometimes desirable to have a starting frequency lower than 2 GHz, sometimes as low as a few megahertz. In the prior art the provision of such low frequencies required both a separate low frequency band generator to supply the swept low frequency signal and a cumbersome and lossy electromechanical broad band switch to switch between the high frequency output of the YIG filter and the output of the low frequency band generator. Because such electromechanical switches are inherently slow compared with the sweep rates typically used for testing microwave communication circuits, it was difficult have a signal that was continuously swept from a few megahertz to 18 GHz or more. In addition, even if the sweep rate were low enough to accommodate the switching speed of such switches they would often wear out under the repetitive use usually given a swept frequency signal generator.

SUMMARY OF THE INVENTION

In accordance with the preferred embodiment of the present invention, a swept frequency signal generator comprises a low and a high frequency tuneable source connected to a YIG tuned frequency multiplier. The high frequency source, e.g. 2-6.7 GHz, is connected to a step recovery diode which in turn is connected to the input coupling loop of a YIG tuned filter to produce a broad band output signal, e.g. 2-26 GHz. The low frequency source, e.g. 10 MHz to 2 GHz, is connected to one end of the output coupling loop of the YIG filter, the other end of which is connected to the filter output. A PIN diode and a capacitor are connected in series between ground and the junction between the output coupling loop and the low frequency source. When a forward d.c. bias is applied to the PIN diode, the output of the low frequency source and the end of the coupling loop to which it is connected are shunted to ground, allowing the YIG filter to operate in the normal manner. When the PIN diode is reverse biased, the shunt impedance of the output coupling loop is increased substantially, causing most of the signal from the step recovery diode to be reflected back into the YIG sphere. In addition, the output of the low frequency source is now isolated from ground and the low frequency swept signals can pass through the output coupling loop directly to the output.

By passing both the low frequency and high frequency swept signals directly through the YIG filter in the manner described above the losses inherent in electromechanical switches are thereby avoided. In addition, the PIN diode can be switched on and off very quickly for millions of cycles without any adverse effects, thus allowing the swept frequency signal generator to sweep continuously over the entire range of both the low frequency source and the multiplied high frequency source, e.g. from 10 MHz to 26 GHz. For increased isolation between the low and high frequency sources, the signal from one can be turned off while the signal from the other is being passed through the YIG filter.

DESCRIPTION OF THE DRAWINGS

FIG. 2 shows a top view of a circuit assembly embodying the preferred embodiment of the present invention.

FIG. 3 shows a bottom view of the circuit assembly of FIG. 2.

FIG. 4 shows an end view of the circuit assembly of FIG. 2.

FIG. 5 shows a cross-section view of an electromagnet assembly including the circuit board of FIG. 2.

DESCRIPTION OF THE PREFERRED EMBODIMENT

Figure 1:
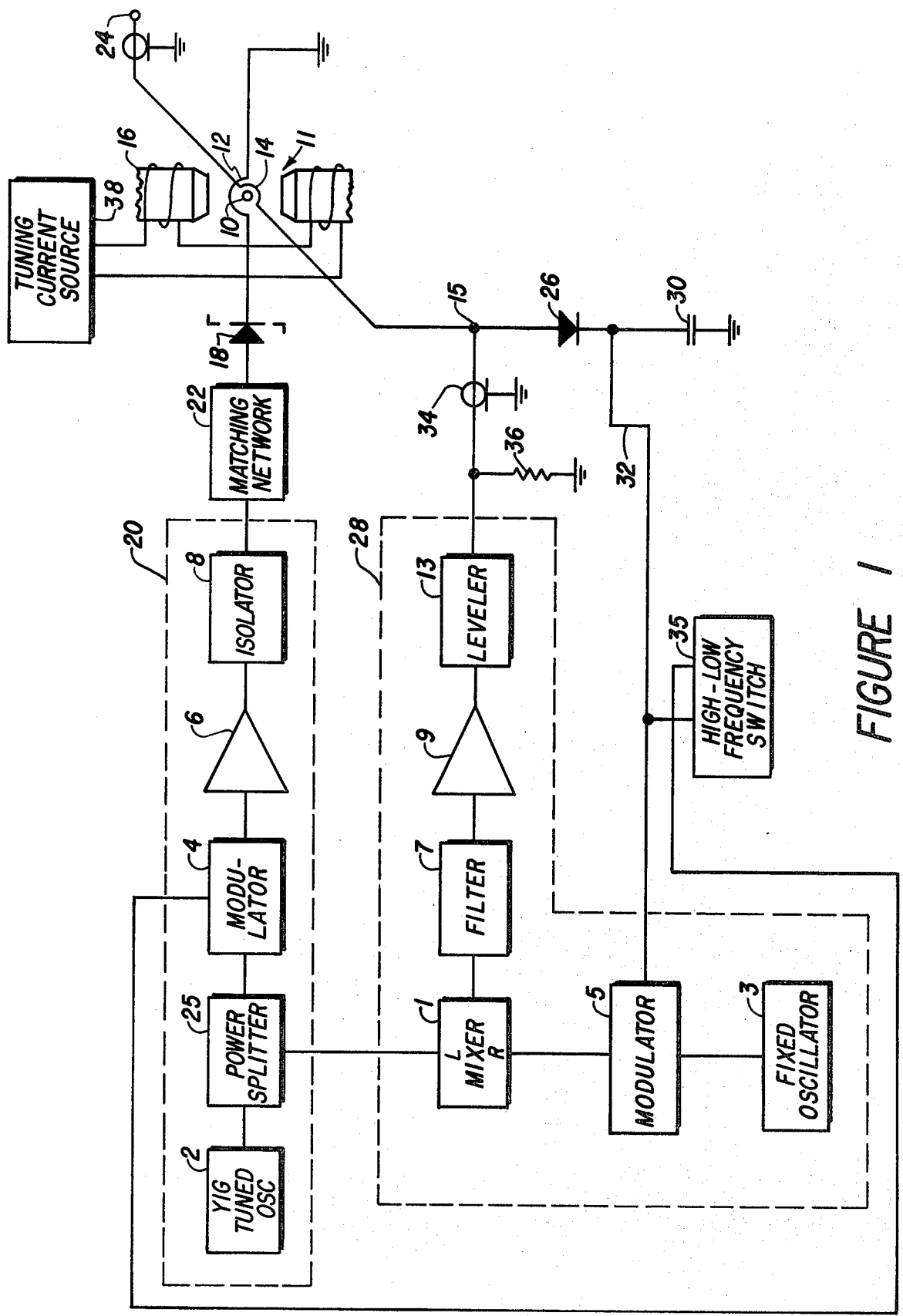
FIG. 1 shows a schematic diagram of the preferred embodiment of the present invention.

In the schematic diagram of FIG. 1, a yttrium-iron-garnet (YIG) filter 11 is shown as comprising a YIG sphere 10, an input coupling loop 12, an output coupling loop 14 and an electromagnet 16. The structure and operation of YIG filters is described in further detail in the *Hewlett-Packard Journal* article cited above. A step recovery diode 18 is connected to one end of input coupling loop 12, the other end of which is connected to ground. Step recovery diode 18 is driven by a high frequency swept source 20 through a matching network 22. High frequency swept source 20 may be a YIG tuned transistor oscillator 2 that tunes from 2 to 6.7 GHz (similar to the oscillator shown in the previously cited article). YIG tuned oscillator 2 is connected through a power splitter 25, a modulator 4, an amplifier 6 and an isolator 8 to matching network 22. Matching network 22 may be an inductive-capacitive ladder network for matching the input impedance of step recovery diode 18 to the output impedance of high frequency swept source 20.

One end of output coupling loop 14 is connected to an output terminal 24 and the other end is connected to the anode of a switching diode 26, preferably a PIN diode, forming a node 15. Also connected to the anode of PIN diode 26 is the output of a low frequency swept source 28. Low frequency swept source 28 comprises a mixer 1 connected to the output YIG tuned oscillator 2 through power splitter 25 and to the output of a 2 GHz fixed oscillator 3 through a modulator 5. The output of the mixer passes through a low pass filter 7, an amplifier 9 and a leveler 13. When YIG tuned oscillator 2 sweeps from 2.01 to 4.5 GHz the output signal of low frequency swept source 28 will sweep from 10 MHz to 2.5 GHz.

The cathode of PIN diode 26 is connected to a capacitor 30 and to a control line 32. When a forward d.c. bias is applied to PIN diode 26 via the control line the diode will conduct and effectively connect node 15 to a.c. ground through capacitor 30. Capacitor 30 is chosen so that it is a r.f. short in the output frequency range of high frequency swept source 20 and has as low a reactance as possible in the frequency range of low frequency swept source 28 without introducing undesirable series resonances in the high frequency range. PIN diode 26 is chosen to have a low series resistance, e.g. less than 5 ohms. As shown in FIG. 1, a d.c. path is provided through PIN diode 26 by control line 32, a coaxial transmission line 34 and a resistor 36. Resistor 36 may be a part of the output circuit of low frequency swept source 28. When a negative voltage is applied to control line 32 PIN diode 26 will be forward biased.

When PIN diode 26 is forward biased, YIG filter 11 will act like a normal YIG filter. By applying the appropriate tuning current from a tuning current source 38 to electromagnet 16, YIG sphere 10 will resonate at the desired frequency to select one of the harmonics of the output of high frequency swept source 20 generated by step recovery diode 18. With one end of output coupling loop 14 grounded by PIN diode 26, the selected harmonic will be coupled to output terminal 24.

A different mode of operation is realized when PIN diode 26 is reverse biased by placing a positive voltage on control line 32. In this case the output of low frequency swept source 28 is no longer grounded, and the output signal will pass through output coupling loop 14 to output terminal 24. At the same time, because one end of output coupling loop 14 is no longer grounded, the shunt impedance of the output coupling loop of YIG filter 11 will be increased significantly (from about 1 to about 50 ohms); and most of the signals from step recovery diode 18 will be reflected back into the YIG sphere. In addition, as a secondary effect it will appear as if there is more series resistance between step recovery diode 18 and ground, reducing the current flow through and therefore the generation of harmonics by the diode.

Thus by simply changing the bias on PIN diode 26 the signal appearing on output terminal 24 can be switched from a harmonic of high frequency swept source 20 to the output of low frequency swept source 28. However, at some frequencies the isolation between the high and low frequency swept sources may not be as high as would be desired. This isolation can be increased by reducing or shutting off the signal from one of the sources while the signal from the other is being passed through YIG filter 11. For example, when PIN diode 26 is forward biased, the signal from low frequency swept source 28 can be reduced in amplitude by several orders of magnitude through the use of modulator 5. Typically such a modulator uses one or more PIN diodes connected in shunt across the output of fixed oscillator 3. When those PIN diodes are forward biased the output of fixed oscillator 3 will be effectively shut off. In addition, amplifier 9 or leveler 13 can be shut off to reduce the amplitude of the low frequency swept signal. Likewise, when PIN diode 26 is reverse biased, the output signal from YIG tuned oscillator 2 can be effectively shut off by modulator 4 which is similar to modulator 5. As above, amplifier 6 can also be turned off. Since the modulators use PIN diodes they can, of course, be switched on and off quickly by a high-low frequency switch 35 which applies the appropriate bias to the modulator diodes as well as to PIN diode 26, thereby permitting the signals from the low and high frequency swept sources to be turned on and off with each sweep. Such a switch can be a simple flip-flop controlled by frequency control circuitry such as that shown in the previously cited article.

Although it has been found that the illustrated configuration of PIN diode 26 and capacitor 30 minimizes series inductance and thus maximizes high frequency performance, it is not necessary that they be connected in the order shown. They could be interchanged and still perform the same function. If they were interchanged, it would not be necessary to use resistor 36 as a d.c return path when PIN diode 26 is forward biased. It is also possible to build the circuit by connecting the cathode of diode 26 directly to ground, thereby eliminating capacitor 30, and supplying the bias either through resistor 36 or through an inductor connected to the center conductor of the coaxial transmission line 34.

FIGS. 2, 3 and 4 show the physical configuration of the preferred embodiment of the present invention. A sapphire substrate 40 has a hole 42 in which YIG sphere 10 is mounted. Capacitor 30 is mounted to a conductive pad on sapphire substrate 40, and PIN diode 26 is mounted directly on top of capacitor 30. Output coupling loop 14 comprises a metallic wire or strap connected to PIN diode 26 and arched over YIG sphere 10. The other end of output coupling loop 14 is attached to a conductive pad 44. The center conductor 45 of a coaxial transmission line 46 is also attached to conductive pad 44. Coaxial transmission line 46 is in turn connected to output terminal 24.

The conductive pad to which capacitor 30 is attached is connected to a ground strip 48 along one edge of sapphire substrate 40, and the top side of capacitor 30 is connected to another conductive pad 50 to which control line 32 is attached. Step recovery diode 18 is mounted on the bottom side of sapphire substrate 40 and input coupling loop 12 in the form of metallic wire or strap is connected between step recovery diode 18 and ground strip 48. Input coupling loop 12 also arches over YIG sphere 10 but is oriented orthogonally to output coupling loop 14. Step recovery diode 18 is usually mounted on a capacitor 52 to which is connected a strip transmission line 54 from matching network 22.

FIG. 5 shows the electromagnet 16 as comprising an upper magnet 56 and a lower magnet 58. Upper magnet 56 has an upper coil 60 wound around an upper pole piece 62 and lower magnet 58 comprises a lower coil 64 wound around a lower pole piece 66. Sapphire substrate 40 is supported between upper magnet 56 and lower magnet 58 so that YIG sphere 10 is centered between the upper and lower pole pieces.

I claim:
1. A tuneable frequency multiplier comprising:
   electromagnetically resonant means having a variable resonance frequency;
   first signal input means for receiving a first electromagnetic signal;

harmonic signal generating means connected to the first signal input means for generating a harmonic signal in response to the first electromagnetic signal;

first coupling means connected to the harmonic signal generating means for coupling the harmonic signal to the electromagnetically resonant means;

an output;

second coupling means connected to the output for coupling a signal from the electromagnetically resonant means to the output;

second signal input means for receiving a second electromagnetic signal connected to the second coupling means at a coupling node;

electrically controlled shunt means connected to the coupling node and having a control input for shunting the coupling node means to ground in response to a first control signal on the control input and for isolating the coupling node from ground in response to a second control signal on the control input whereby a signal from the electromagnetically resonant means is coupled to the output when the first control signal is applied to the shunt means control input and a signal from the second signal input is coupled to the output when the second control signal is applied to the shunt means control input.

2. A tuneable frequency multiplier as in claim 1 wherein the electromagnetically resonant means is a yttrium-iron-garnet sphere and the first and second coupling means are oriented orthogonally.

3. A tuneable frequency multiplier as in claim 2 wherein:

the first coupling means comprises a conductor connected between the harmonic signal generating means and ground and situated in close proximity to but out of contact with the yttrium-iron-garnet sphere; and the second coupling means comprises a conductor connected between the coupling node and the output and situated in close proximity to but out of contact with the yttrium-iron-garnet sphere.

4. A tuneable frequency multiplier as in claim 3 wherein the shunt means includes a switching diode.

5. A tuneable frequency multiplier as in claim 4 wherein the harmonic signal generating means includes a step-recovery diode and the switching diode is a PIN diode.

6. A tuneable frequency multiplier as in claim 4 wherein the switching diode is located immediately adjacent the yttrium-iron-garnet sphere.

7. A tuneable frequency multiplier as in claim 6 wherein the switching diode is in the form of a semiconductor chip fastened directly to a series connected capacitor.

8. A tuneable frequency multiplier as in claim 7 wherein the shunt means control input is connected between the shunt means capacitor and the PIN diode.

9. A tuneable frequency multiplier as in claim 1 or 2 further comprising a first signal source connected to the first signal input means for producing the first electromagnetic signal, and a second signal source connected to the second signal input means for producing the second electromagnetic signal, each of the first and second signal sources including amplitude control means having control inputs for controlling the amplitude of the first and second electromagnetic signals, wherein the first signal source amplitude control means reduces the amplitude of the first electromagnetic signal in response to the second control signal and the second signal source amplitude control means reduces the amplitude of the second electromagnetic signal in response to the first control signal.

* * * * *